United States Patent
Chang et al.

(10) Patent No.: US 8,710,680 B2
(45) Date of Patent: Apr. 29, 2014

(54) ELECTRONIC DEVICE PACKAGE AND FABRICATION METHOD THEREOF

(76) Inventors: Shu-Ming Chang, Tucheng (TW); Bai-Yao Lou, Hsinchu (TW); Ying-Nan Wen, Hsinchu (TW); Chien-Hung Liu, Xindian (TW)

(*) Notice: Subject to any disclaimer, the term of this patent is extended or adjusted under 35 U.S.C. 154(b) by 205 days.

(21) Appl. No.: 13/052,769

(22) Filed: Mar. 21, 2011

(65) Prior Publication Data

US 2011/0233782 A1 Sep. 29, 2011

Related U.S. Application Data

(60) Provisional application No. 61/318,056, filed on Mar. 26, 2010.

(51) Int. Cl.
*H01L 29/40* (2006.01)

(52) U.S. Cl.
USPC .................................. 257/784; 257/786

(58) Field of Classification Search
USPC ........................... 257/784, 786, 758
See application file for complete search history.

(56) References Cited

U.S. PATENT DOCUMENTS

| | | | |
|---|---|---|---|
| 2009/0039529 A1* | 2/2009 | Mueller et al. | 257/778 |
| 2009/0045513 A1* | 2/2009 | Kim et al. | 257/738 |
| 2009/0127686 A1* | 5/2009 | Yang et al. | 257/686 |
| 2009/0152715 A1 | 6/2009 | Shim et al. | |
| 2009/0184411 A1* | 7/2009 | Chung et al. | 257/691 |
| 2009/0261466 A1* | 10/2009 | Pagaila et al. | 257/686 |
| 2011/0194265 A1* | 8/2011 | Su et al. | 361/761 |
| 2012/0217647 A9* | 8/2012 | Shim et al. | 257/774 |

* cited by examiner

*Primary Examiner* — S. V. Clark
(74) *Attorney, Agent, or Firm* — Liu & Liu

(57) ABSTRACT

An electronic device package is disclosed. The package includes at least one semiconductor chip having a first surface and a second surface opposite thereto, in which at least one redistribution layer is disposed on the first surface of the semiconductor chip and is electrically connected to at least one conductive pad structure. At least one abut portion is disposed on the redistribution layer and electrically contacting thereto. A passivation layer covers the first surface of the semiconductor chip and surrounds the abut portion. A substrate is attached onto the second surface of the semiconductor chip. A fabrication method of the electronic device package is also disclosed.

13 Claims, 13 Drawing Sheets

ELECTRONIC DEVICE PACKAGE AND FABRICATION METHOD THEREOF

CROSS REFERENCE TO RELATED APPLICATIONS

This application claims the benefit of U.S. Provisional Application No. 61/318,056, filed Mar. 26, 2010, the entirety of which is incorporated by reference herein.

BACKGROUND OF THE INVENTION

1. Field of the Invention

The invention relates to an electronic package and more particularly to an electronic device package and a fabrication method thereof.

2. Description of the Related Art

As demand for electronic or optoelectronic products, such as digital cameras, camera phones, bar code readers, and monitors, increase, semiconductor technology for products made therefrom must develop rapidly, as product trends increase requirement for the semiconductor chip size to be miniaturized and functionality of the semiconductor chip to be increased and become more complex.

Therefore, more than one semiconductor chip is typically placed in a sealed package, due to performance demands, for operational stability. However, since more input/output conductive pads are required for semiconductor chips with multiple functions, the spaces between the conductive bumps in the electronic device package must be reduced to increase the number of the conductive bumps therein; thus, the semiconductor packaging process is made more difficult and manufacturing yields are reduced.

Accordingly, there is a need to develop a novel package structure without the above problems.

BRIEF SUMMARY OF THE INVENTION

An embodiment of an electronic device package comprises at least one semiconductor chip having a first surface and a second surface opposite thereto, in which at least one redistribution layer is disposed on the first surface of the semiconductor chip and is electrically connected to at least one conductive pad structure. Also, at least one abut portion is disposed on the redistribution layer and electrically contacted thereto. A passivation layer covers the first surface of the semiconductor chip and surrounds the abut portion. A substrate is attached onto the second surface of the semiconductor chip.

A method for fabricating an electronic device package comprises providing at least one semiconductor chip having a first surface and a second surface opposite thereto, in which the semiconductor chip has at least one via opening therein, which extends to the first surface, and has at least one conductive pad structure disposed on the bottom of the via opening. The second surface of the semiconductor chip is attached onto a substrate. At least one redistribution layer is formed on the first surface of the semiconductor chip and is electrically connected to the conductive pad structure through the via opening. The first surface of the semiconductor chip is covered with a sacrificial pattern layer, in which the sacrificial pattern layer has an opening to partially expose the redistribution layer. An abut portion is formed in the opening, in which the abut portion electrically contacts the exposed redistribution layer. Next, the sacrificial pattern layer is removed, and the first surface of the semiconductor chip is covered with a passivation layer, such that the passivation layer surrounds the abut portion.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
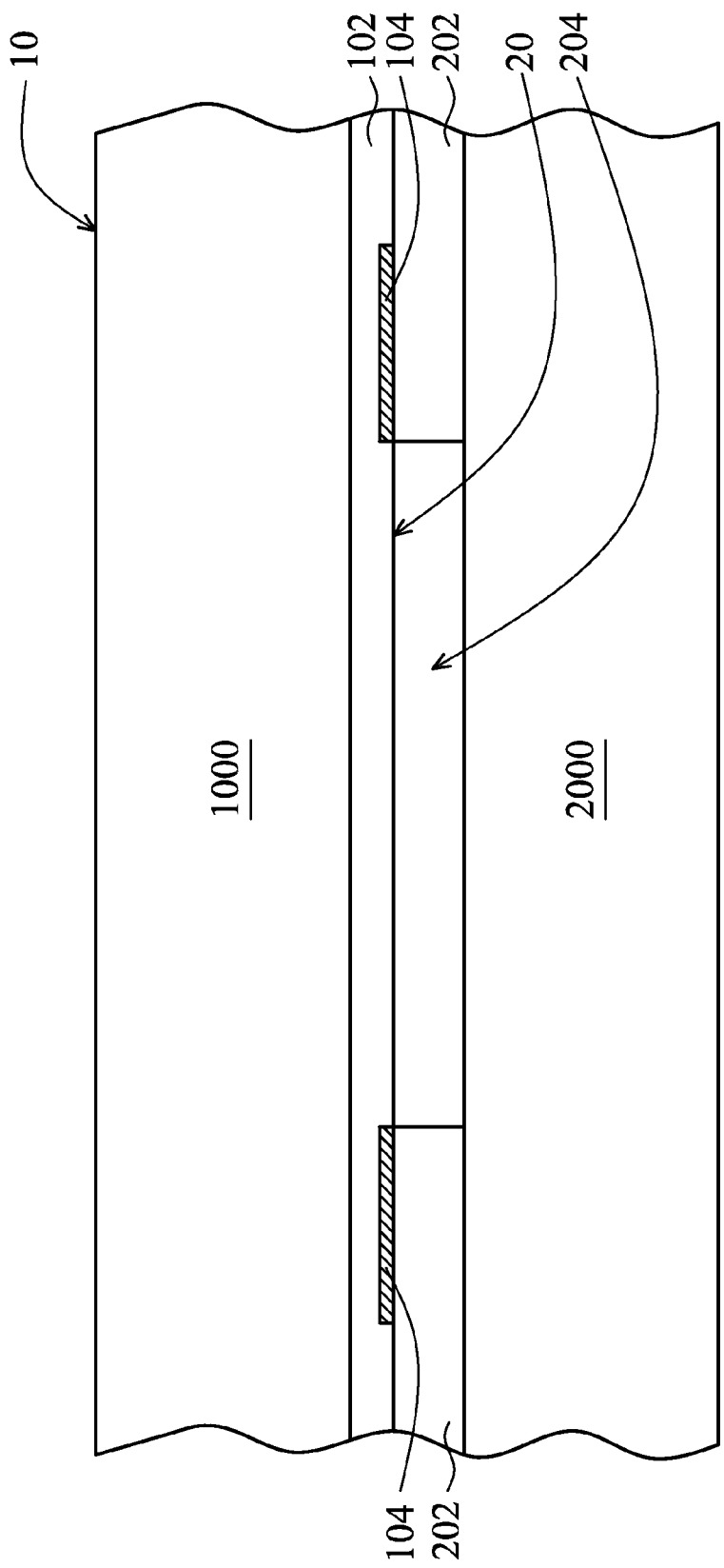
FIGS. 1A to 1I are cross sections of an exemplary embodiment of a method for fabricating an electronic device package according to the invention.

The following description encompasses the fabrication and the purpose of the invention. It can be understood that this description is provided for the purpose of illustrating the fabrication and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

FIGS. 1I, 2, 3, and 4 are various exemplary embodiments of an electronic device package according to the invention. In the embodiments, the electronic device package may be applied to various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer level package (WLP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

A wafer level package process involving electronic devices is first packaged at the wafer level and then diced into individual packages. However, in a specific embodiment, separate semiconductor chips may be, for example, redistributed on a carrier wafer for a subsequent packaging process, which may be called a wafer level package process. In addition, a stacking process may also be used in the wafer level package process mentioned above to stack a plurality of wafers having integrated circuits to form electronic device packages of multi-layered integrated circuit devices.

Figure 1B:
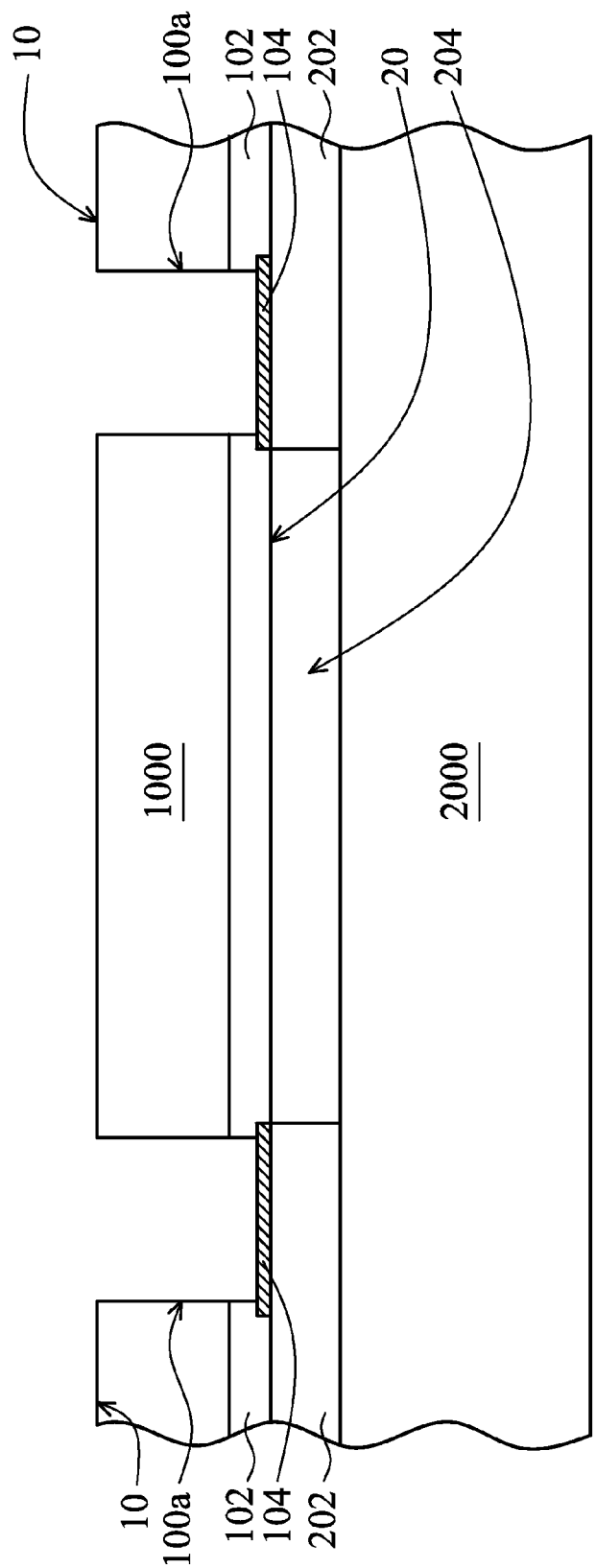
Figure 1C:
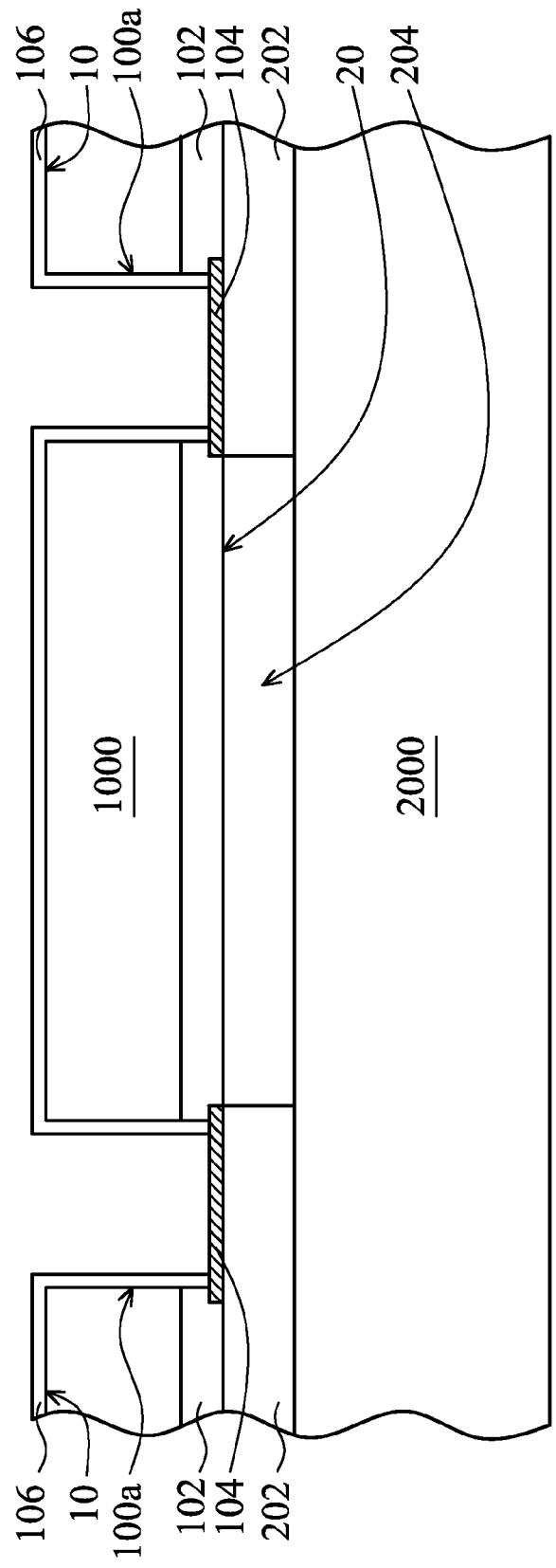
Figure 1D:
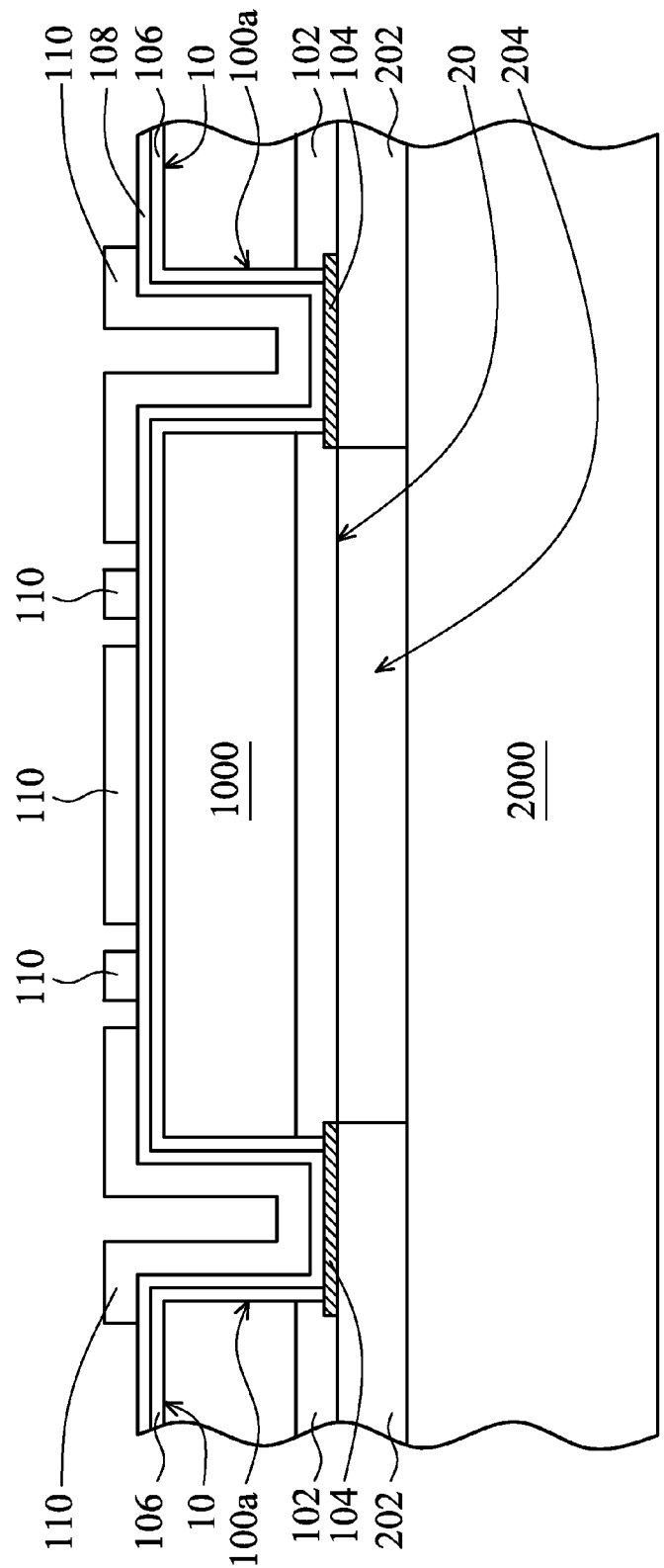
Figure 1E:
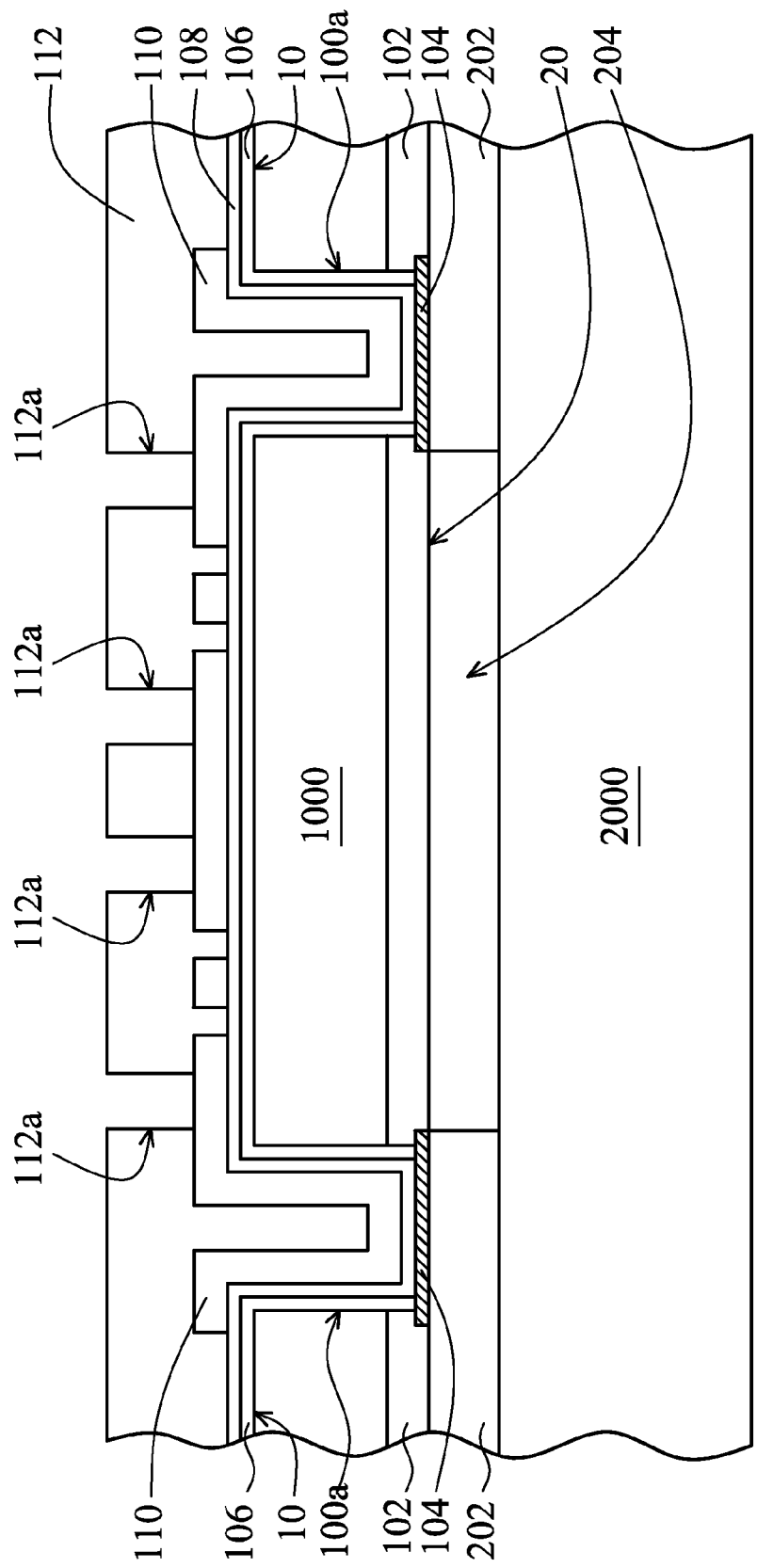
Figure 1F:
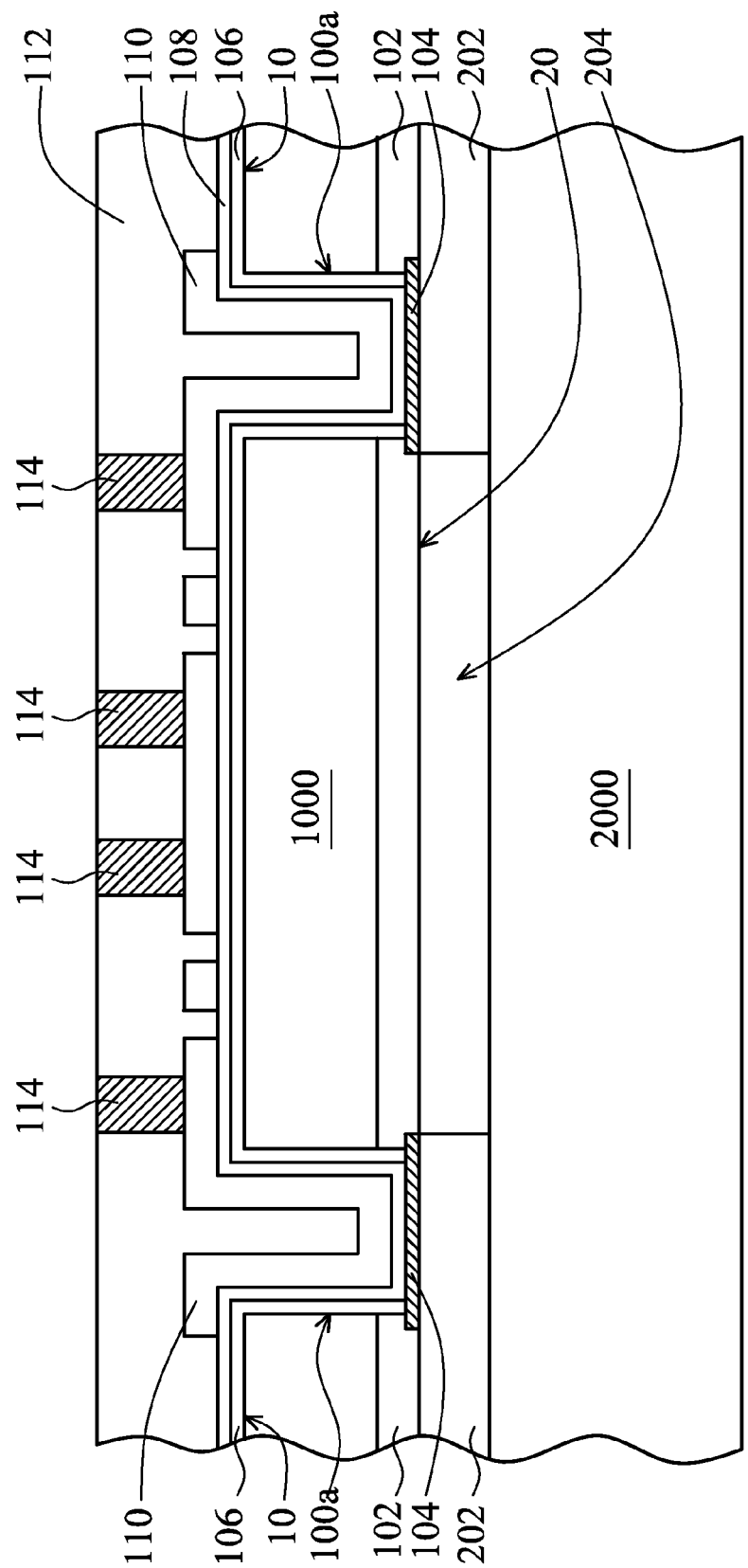
Figure 1G:
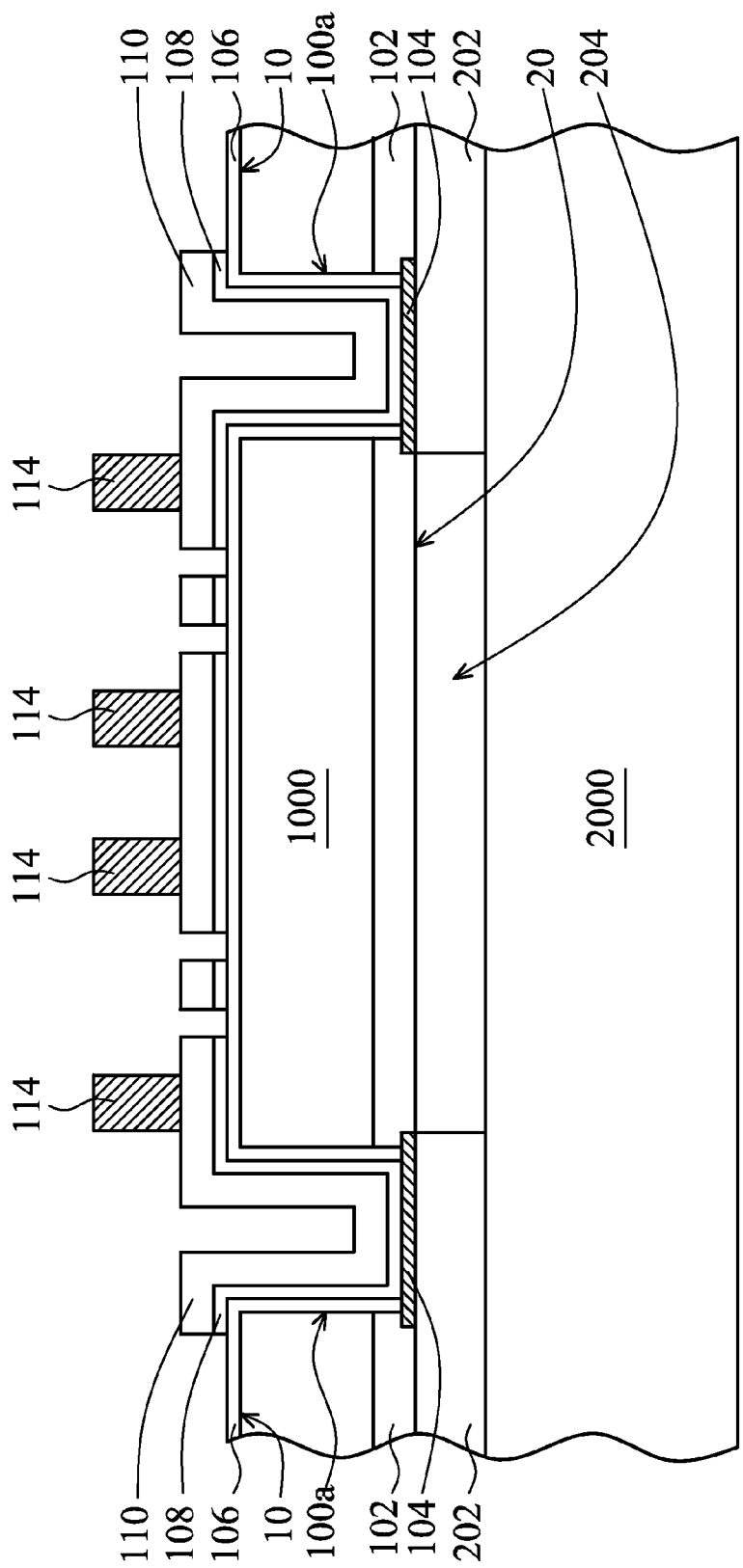
Figure 1H:
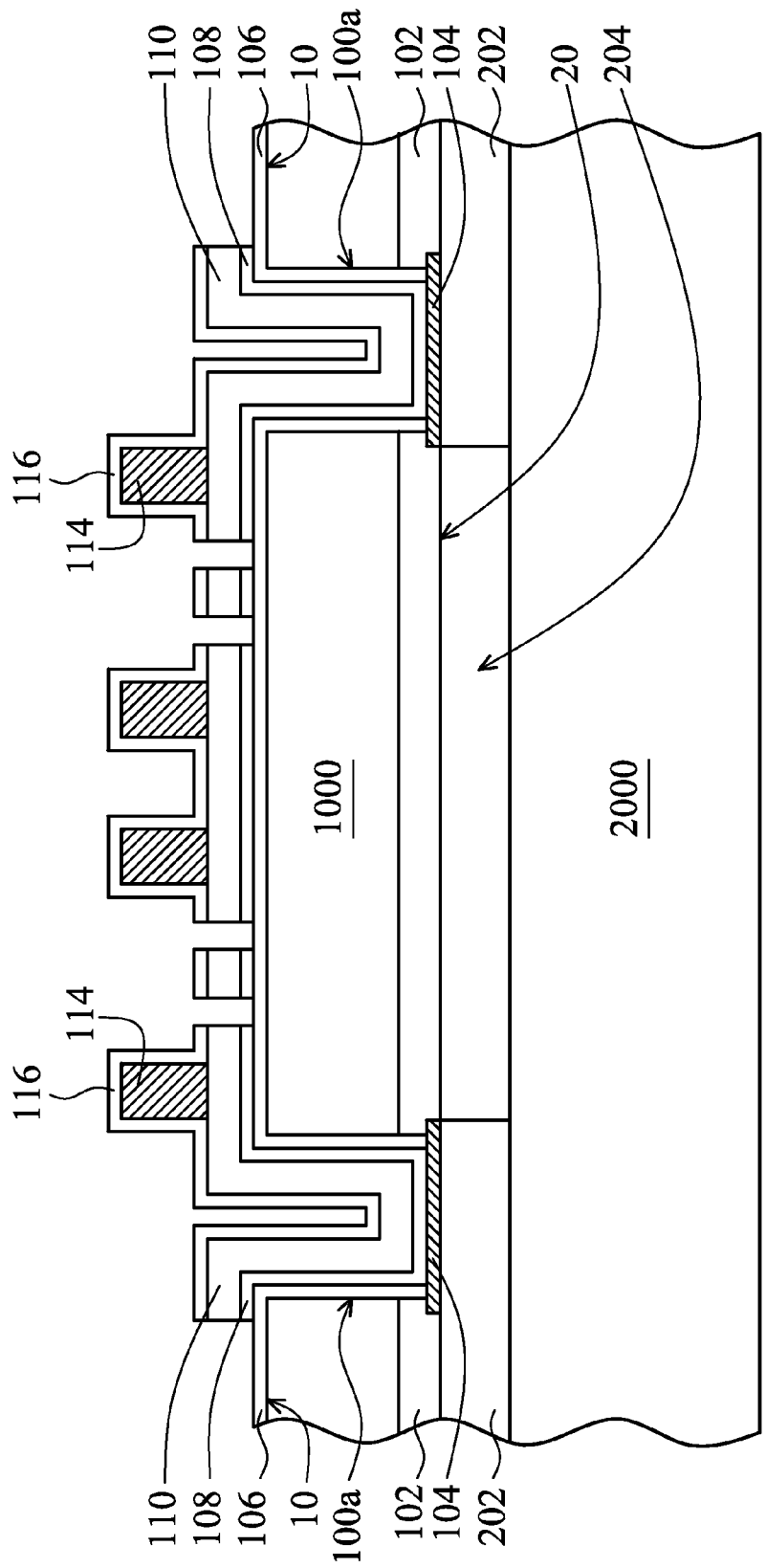
Figure 1I:
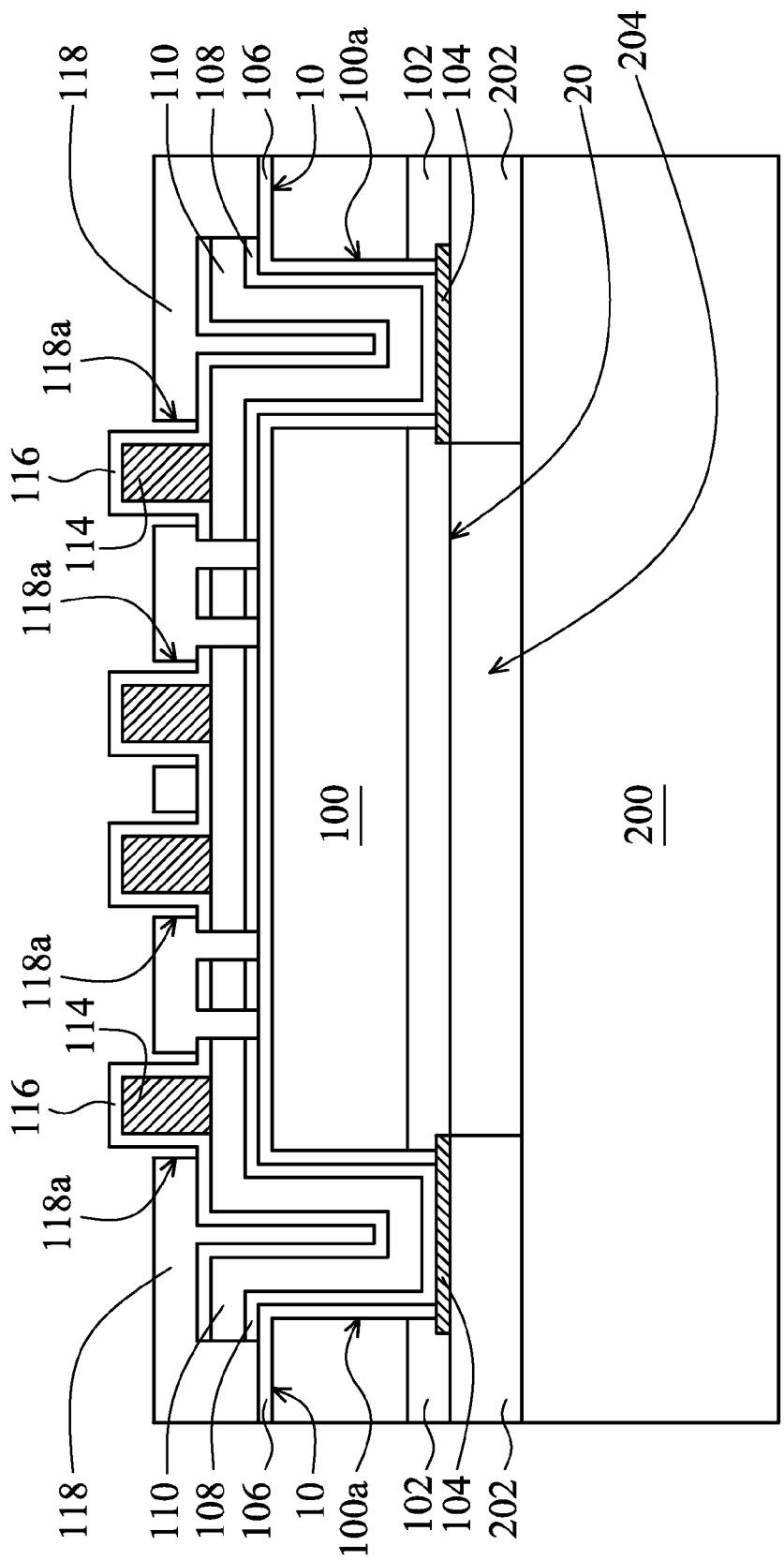

Referring to FIG. 1I, the electronic device package comprises at least one semiconductor chip 100, such as complementary metal oxide semiconductor image sensor (CIS) chip, micro-electro-mechanical system (MEMS) chip or other integrated circuit chips well known in the art. Here, a CIS chip is exemplarily described as being the semiconductor chip 100. The semiconductor chip 100 has a first surface 10 and a second surface 20 opposite thereto. Moreover, the semiconductor chip 100 may comprise a passivation layer 102 adjacent to the second surface 20, and a plurality of conductive pad structures 104 disposed in the passivation layer 102. The plurality of conductive pad structures 104 is electrically connected to the circuits (not shown) in the semiconductor chip 100 by interconnect structures (not shown). A plurality of redistribution layers (RDLs) 110 is disposed on the first surface 10 of the semiconductor chip 100 and is electrically connected to the corresponding conductive pad structure 104 in the semiconductor chip 100. In one embodiment, the redistribution layer 110 is insulated from the semiconductor substrate in the semiconductor chip 100 by an insulating layer 106, such as a silicon oxide layer. Moreover, a seed layer 108, such as titanium, copper or alloys thereof, is between the redistribution layer 110 and the conductive pad structure 104.

At least one abut portion 114 is disposed on and in direct contact with the corresponding redistribution layer 110. That is, there is no adhesion layer disposed between the redistribution layer 110 and the abut portion 114. In the embodiment, the abut portion 114 may be a single layer structure and serve as an electrical connection between the semiconductor chip 100 and the exterior circuit (e.g., print circuit board (PCB)). Moreover, the abut portion 114 may comprise copper, nickel, gold or a combination thereof or other solder materials well known in the art.

A conductive protection layer 116 covers the surfaces of the redistribution layer 110 and the abut portion 114 and may comprise copper, nickel, gold or a combination thereof to prevent the redistribution layer 110 and the abut portion 114 from being oxidized due to environmental factors.

A passivation layer 118, such as a solder mask layer, covers the first surface 10 of the semiconductor chip 100. The passivation layer 118 has a plurality of openings 118a, such that the passivation layer 118 surrounds the plurality of abut portions 114 though the plurality of openings 118a. In particular, the plurality of abut portions 114 covered by the conductive protection layer 116 protrudes from the upper surface of the passivation layer 118 to serve as conductive bumps. Moreover, a gap is between the opening 118a in the passivation layer 118 and the corresponding abut portion 114 covered by the conductive protection layer 116, such that the passivation layer 118 does not contact the plurality of abut portions 114 covered by the conductive protection layer 116.

A substrate 200 is attached onto the second surface 20 of the semiconductor chip 100. When the substrate 200 is used as a carrier substrate for the semiconductor chip 100, the substrate 200 may comprise, but is not limited to, a thermally conductive substrate, such as a metal or raw silicon substrate or other semiconductor substrates without any circuits therein. When the substrate 200 is used as a light transmitting substrate, the substrate 200 may comprise, but is not limited to, a transparent substrate, such as a glass, quartz, plastic or opal substrate, and a color filter layer and/or an antireflective layer may be optionally formed on the transparent substrate. In the embodiment, the substrate 200 may be a transparent substrate that is attached onto the semiconductor chip 100 through the dam or adhesion layer. Here, a dam 202 is exemplarily described. A cavity 204 created by the dam 202 typically corresponds to the sensing area (not shown) of the semiconductor chip 100 (e.g., the CIS chip).

Figure 2:
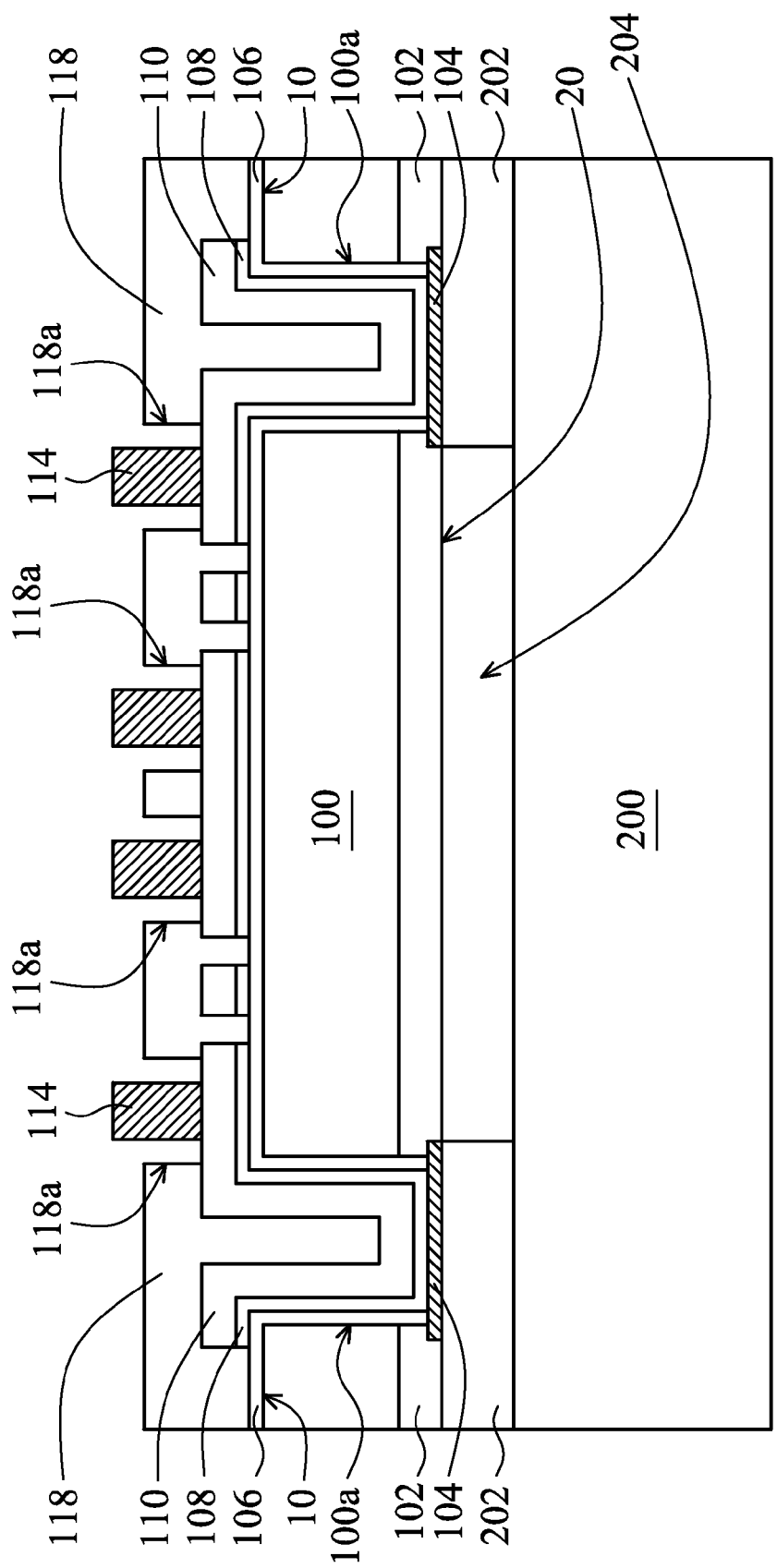
FIGS. 2 to 4 are cross sections of various exemplary embodiments of an electronic device package according to the invention.

Referring to FIG. 2, which illustrates another exemplary embodiment of an electronic device package according to the invention. Elements in FIG. 2 that are the same as those in FIG. 1I are labeled with the same reference numbers as in FIG. 1I and are not described again for brevity. Unlike the embodiment shown in FIG. 1I, the surfaces of the plurality of the abut portions 114 and the redistribution layer 110 are not covered by the conductive protect layer 116. Accordingly, the plurality of the abut portions 114 and the redistribution layer 110 may comprise a conductive material with high resistant to oxidation, such as nickel, gold, titanium, copper or combinations thereof.

Figure 3:
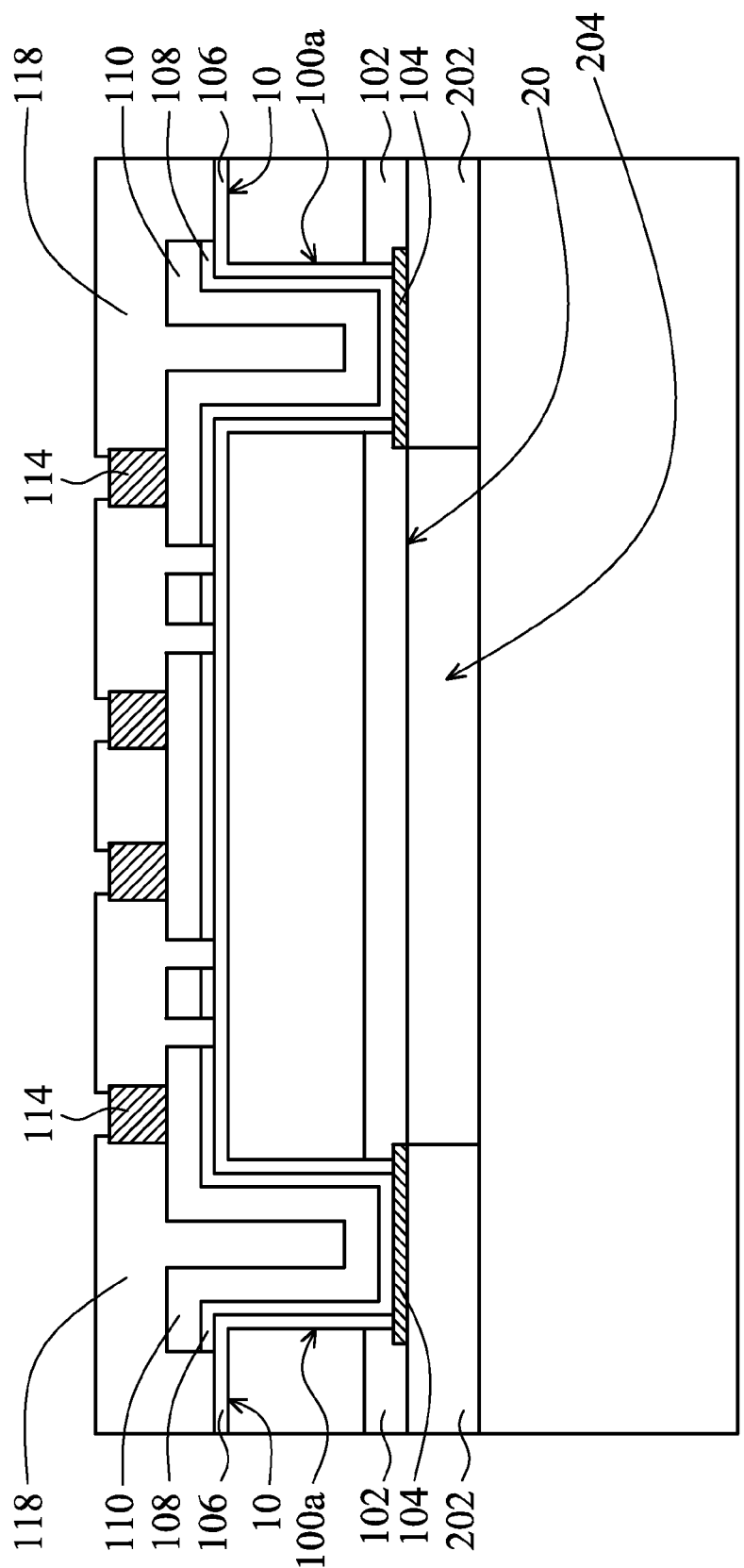

Referring to FIG. 3, which illustrates yet another exemplary embodiment of an electronic device package according to the invention. Elements in FIG. 3 that are the same as those in FIG. 1I are labeled with the same reference numbers as in FIG. 1I and are not described again for brevity. In the embodiment, the surfaces of the plurality of the abut portions 114 and the redistribution layer 110 may be covered by the conductive protect layer 116 or not (as shown in FIGS. 1I and 2, respectively). Unlike the above embodiments, the passivation layer 118 partially covers the plurality of the abut portions 114 or an upper surface of the plurality of the abut portions 114 covered by the conductive protection layer 116. Namely, the passivation layer 118 is in direct contact with the plurality of abut portions 114 or an upper surface of the plurality of the abut portions 114 covered by the conductive protection layer 116. When the semiconductor chip 100 is mounted onto an exterior circuit (e.g., PCB), the semiconductor chip 10 is electrically connected to the PCB by electrical contact between the plurality of the abut portions 114 and the bumps on the PCB.

Figure 4:
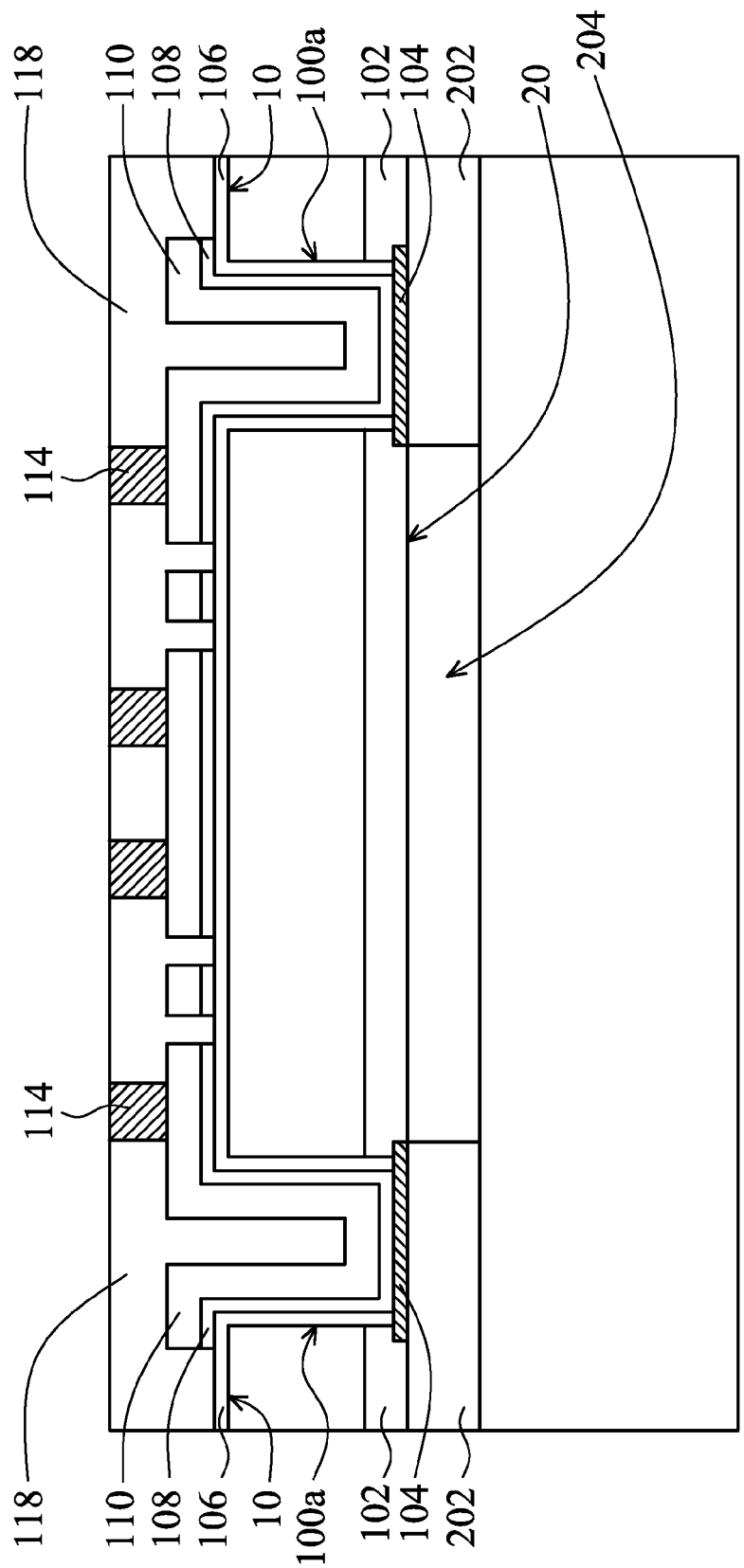

Referring to FIG. 4, which illustrates further another exemplary embodiment of an electronic device package according to the invention. Elements in FIG. 4 that are the same as those in FIG. 1I are labeled with the same reference numbers as in FIG. 1I and are not described again for brevity. In the embodiment, the surfaces of the plurality of the abut portions 114 and the redistribution layer 110 may be covered by the conductive protect layer 116 or not (as shown in FIGS. 1I and 2, respectively). Unlike the above embodiments, the passivation layer 118 may comprise a non-light sensitive solder mask. Moreover, the upper surface of the passivation layer 118 is not lower than that of the plurality of the abut portions 114 (or that of the plurality of abut portions 114 which have an upper surface covered by the conductive protection layer 116). For example, the upper surface of the passivation layer 118 is substantially level with that of the plurality of abut portions 114. Moreover, the passivation layer 118 is in direct contact with the sidewalls of the plurality of the abut portions 114 (or that of the plurality of abut portions 114 which have an upper surface covered by the conductive protection layer 116), such that there is no gap therebetween.

FIGS. 1A to 1I are cross sections of an exemplary embodiment of a method for fabricating an electronic device package according to the invention. Referring to FIG. 1A, a semiconductor wafer 1000 comprising a plurality of semiconductor chip regions, such as CIS chip regions, is provided. Here, in order to simplify the diagram, only a single semiconductor chip region is depicted. The semiconductor wafer 1000 has a first surface 10 and a second surface 20 opposite thereto. Moreover, each semiconductor chip region may comprise a passivation layer 102 adjacent to the second surface 20, and a plurality of conductive pad structures 104 is disposed in the passivation layer 102.

Moreover, a substrate 2000, such as a glass, quartz, plastic or opal transparent wafer is provided. A color filter layer and/or an antireflective layer may be optionally formed on the transparent wafer. The substrate 2000 is attached onto the second surface 20 of the semiconductor wafer 1000 through the dam or the adhesion layer. In the embodiment, the substrate 2000 is attached onto the second surface 20 of the semiconductor wafer 1000 through a dam 202. A cavity 204, created by the dam 202, typically corresponds to the sensing area (not shown) of the semiconductor chip region, such as a CIS chip region (not shown).

Referring to FIG. 1B, the semiconductor wafer 1000 is thinned to a desired thickness (e.g., 100 μm) by etching, milling, grinding or polishing. Thereafter, a plurality of via openings 100a is formed in each semiconductor chip region of the semiconductor wafer 1000 by conventional lithography and etching processes and corresponds to the plurality of conductive pad structures 104 of each semiconductor chip region. The via opening 100a may extend from the first surface 10 to the second surface 20 and expose the corresponding conductive pad structure 104.

Figure 1J:
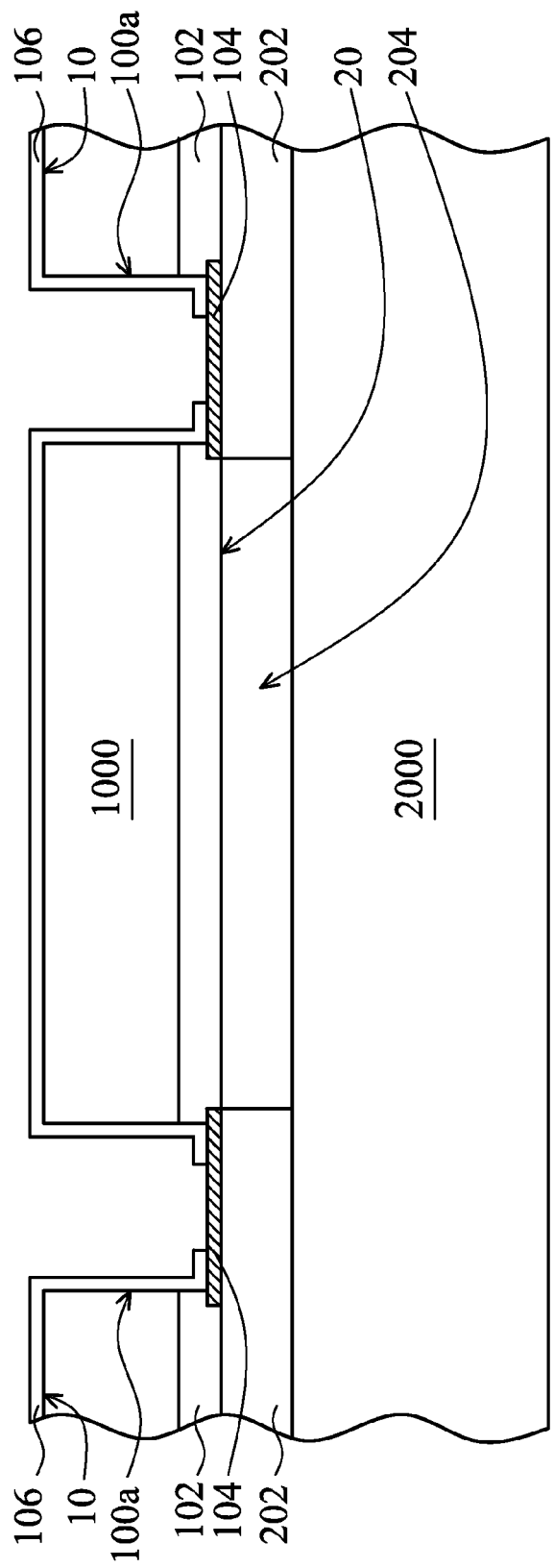
FIG. 1J is a cross section of another embodiment of an intermediate step for fabricating an electronic device package according to the invention.

Referring to FIG. 1C, an insulating layer 106, such as an oxide layer, can be conformally formed on the inner surfaces of the first surface 10 of the semiconductor wafer 1000 and each via opening 100a by chemical vapor deposition (CVD) or other suitable deposition processes, thereby providing electrical isolation between the subsequent redistribution layers and the semiconductor wafer 1000. Thereafter, the insulating layer 106 on the bottom of each via opening 100a is removed to expose the conductive pad structure 104. In another embodiment, the insulating layer 106 on the bottom of the via opening 100a may not be entirely removed, but still expose the conductive pad structure 104, as shown in FIG. 1J. The insulating layer 106 shown in FIGS. 1C and 1J can be selectively applied in the present invention. In order to simplify the description, the insulating layer 106 shown in FIG. 1C is exemplarily described.

Referring to FIG. 1D, a seed layer 108 is conformally on the surface of the insulating layer 106, such that the seed layer 108 electrically contacts the conductive pad structure 104 through the via opening 100a. In one embodiment, the seed layer 108 may comprise titanium, tungsten nitride, nickel, copper or combinations thereof, to enhance the adhesion between the subsequent redistribution layers and the conductive pad structures 104. Thereafter, a conductive layer (not shown) that may comprise copper, nickel, gold or combinations thereof may be formed on the seed layer 108 by plating. Next, the conductive layer is patterned by lithography and etching processes, thereby forming a plurality of redistribution layers 110 on the first surface 10 of the semiconductor wafer 1000. Each redistribution layer 110 is electrically connected to the corresponding conductive pad structure 104 through the seed layer 108 in the via opening 100a.

Referring to 1E, the first surface 10 of the semiconductor wafer 1000 is covered by a sacrificial pattern layer 112, such as a dry film or a wet resist. In the embodiment, the sacrificial pattern layer 112 has a plurality of openings 112a. Each opening 112a partially exposes the corresponding redistribution layer 110.

Referring to FIG. 1F, an abut portion 114 with a single layer structure is formed in each opening 112a by plating, such that the abut portion 114 is in direct contact with the redistribution layer 110. The abut portion 114 may comprise copper, nickel, gold, solder material or combinations thereof. It can be understood that the thickness of the sacrificial pattern layer 112 is based on the desired height of the abut portion 114. In one embodiment, the thickness of the sacrificial pattern layer 112 is about 50 μm.

Referring to FIG. 1G, the sacrificial pattern layer 112 is removed. Next, the seed layer 108 uncovered by the redistribution layer 110 is removed. Thereafter, a conductive protection layer 116 is formed on the surfaces of the redistribution layer 110 and the abut portion 114 by electroless plating, as shown in FIG. 1H. In the embodiment, the conductive protection layer 116 may comprise nickel, gold or combinations thereof.

Referring to FIG. 1I, a passivation layer 118 is formed on the first surface 10 of the semiconductor wafer 1000. The passivation layer 118 has a plurality of openings 118, such that the passivation layer 118 surrounds the abut portions 114 that has a surface covered by the conductive protection layer 116. In the embodiment, the passivation layer 118 may be comprised of a solder mask material. Accordingly, after performing the lithography process, the abut portions 114 that have a surface covered by the conductive protection layer 116 protrude from the upper surface of the passivation layer 118 to serve as electrical connections, such as bumps, between subsequently formed semiconductor chips and exterior circuits (e.g., PCB). Moreover, there is a gap between the passivation layer 118 and each abut portion 114 that has a surface covered by the conductive protection layer 116, such that the passivation layer 118 does not contact the abut portions 114 that have a surface which is covered by the conductive protection layer 116. Thereafter, a sawing process is performed on the semiconductor wafer 1000 attached onto the substrate 2000, thereby forming a plurality of electronic device packages with at least one semiconductor chip 100. Here, in order to simplify the diagram, only one electronic device package is depicted.

In one embodiment, after partially removing the seed layer 108 (as shown in FIG. 1G), the step of forming the conductive protection layer 116 (as shown in FIG. 1H) can be omitted, and thus the formation of the passivation layer 118 and the sawing process may be performed in sequence, to complete formation of the electronic device package (as shown in FIG. 2).

In another embodiment, when the passivation layer 118 comprises a photosensitive solder mask material, a lithography process can be performed, such that the abut portion 114 or a surface of the abut portion 114 covered by the conductive pad structure 116 can be partially covered by the passivation layer 118. Thereafter, a sawing process is performed to complete formation of the electronic device package (as shown in FIG. 3).

In yet another embodiment, after partially removing the seed layer 108 (as shown in FIG. 1G), a passivation layer 118 is formed on the first surface 10 of the semiconductor wafer 1000, such that the passivation layer 118 entirely covers the redistribution layers 110 and the abut portions 114 (or the abut portions 114 which have a surface covered by the conductive protection layer 116). In the embodiment, the passivation layer 118 may comprise a non-light sensitive solder mask material. Next, a polishing process, such as chemical mechanical polishing (CMP) is performed on the passivation layer 118 until to expose the abut portions 114 (or the abut portions 114 which have a surface covered by the conductive protection layer 116). In the embodiment, the upper surface of the passivation layer 118 is not lower than the upper surface of the abut portions 114 (or the upper surface of the abut portions 114 which have a surface covered by the conductive protection layer 116). Moreover, the passivation layer 118 is in direct contact with the sidewalls of the abut portions 114 (or the sidewalls of the abut portions 114 which have a surface covered by the conductive protection layer 116), such that there is no gap therebetween. Thereafter, a sawing process is performed to complete formation of the electronic device package (as shown in FIG. 4).

According to the aforementioned embodiments, since the abut portions used for electrical connection between the semiconductor chip and the exterior circuit are formed in the openings of the sacrificial pattern layer (e.g., dry film), the intervals of the abut portions can be reduced greatly under allowable lithography process capabilities and thus the number of abut portions in the electronic device package with a predetermined size can be relatively increased. Namely, the aforementioned embodiments can meet the demands of high performance and multi-functional semiconductor chips. Moreover, compared to the conventional conductive bumps formed by printing, the abut portions can be directly formed on the redistribution layers by plating prior to formation of the passivation layer, and thus no additional under-bump metallization (UBM) layer is needed between the conductive bumps and the redistribution layers. Accordingly, manufacturing costs of the electronic device package can be further reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package, comprising:
at least one semiconductor chip having a first surface and a second surface opposite thereto, wherein at least one redistribution layer is disposed on the first surface of the semiconductor chip and is electrically connected to at least one conductive pad structure;
at least one abut portion disposed on the redistribution layer and electrically contacting thereto;
a passivation layer covering the first surface of the semiconductor chip and surrounding the abut portion, wherein upper surface of the abut portion facing away from the first surface is not recessed; and
a substrate attached onto the second surface of the semiconductor chip.

2. An electronic device package, comprising:
at least one semiconductor chip having a first surface and a second surface opposite thereto, wherein at least one redistribution layer is disposed on the first surface of the semiconductor chip and is electrically connected to at least one conductive pad structure;
at least one abut portion disposed on the redistribution layer and electrically contacting thereto;
a passivation layer covering the first surface of the semiconductor chip and surrounding the abut portion; and
a substrate attached onto the second surface of the semiconductor chip,
wherein the abut portion protrudes from an upper surface of the passivation layer and a gap is between the abut portion and the passivation layer.

3. The electronic device package of claim 1, wherein the passivation layer partially covers an upper surface of the abut portion.

4. The electronic device package of claim 1, wherein an upper surface of the passivation layer is not lower than that of the abut portion and is in direct contact with the sidewalls of the abut portions.

5. The electronic device package of claim 1, wherein the abut portion comprises the same material as that of the redistribution layer.

6. The electronic device package of claim 1, further comprises a conductive protection layer which at least covers a surface of the abut portion.

7. The electronic device package of claim 6, wherein the conductive protection layer comprises nickel, gold or combinations thereof.

8. The electronic device package of claim 1, further comprising a seed layer disposed between the redistribution layer and the conductive pad structure.

9. The electronic device package of claim 1, wherein the passivation layer comprises light-sensitive or non-light-sensitive solder mask materials.

10. The electronic device package of claim 1, wherein the semiconductor chip has at least one via opening therein, which extends to the first surface, and the conductive pad structure is disposed on the bottom of the via opening.

11. The electronic device package of claim 1, wherein the upper surface of the abut portion is flat.

12. The electronic device package of claim 11, wherein entire upper surface of the abut portion is flat.

13. The electronic device package of claim 11, wherein the abut portion does not laterally extend into the passivation layer.

* * * * *